United States Patent
Woo et al.

(10) Patent No.: US 10,784,850 B2
(45) Date of Patent: Sep. 22, 2020

(54) POWER TRANSISTOR DEVICE AND METHOD OF CONTROLLING THE SAME

(71) Applicant: SEMICONDUCTOR COMPONENTS INDUSTRIES, LLC, Phoenix, AZ (US)

(72) Inventors: Sangsu Woo, Bupyeong-gu (KR); Jongho Park, Incheon (KR); SangYong Lee, Incheon (KR); SeWoon Kim, Bucheon (KR); Daewon Kim, Incheon (KR); Wontae Lee, Cheonan-Si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 136 days.

(21) Appl. No.: 16/215,787

(22) Filed: Dec. 11, 2018

(65) Prior Publication Data
US 2020/0186141 A1      Jun. 11, 2020

(51) Int. Cl.
*H03K 17/0812*     (2006.01)
*H03K 17/14*       (2006.01)

(52) U.S. Cl.
CPC ..... *H03K 17/08122* (2013.01); *H03K 17/145* (2013.01)

(58) Field of Classification Search
CPC ............ H03K 17/08122; H03K 17/145
See application file for complete search history.

(56) References Cited

U.S. PATENT DOCUMENTS

| 10,326,436 B2 * | 6/2019 | Rogachev | H03K 17/122 |
| 10,418,899 B2 * | 9/2019 | Lui | H03K 17/164 |
| 2002/0020873 A1 | 2/2002 | Klodzinski | |
| 2006/0227478 A1 | 10/2006 | Herr et al. | |

OTHER PUBLICATIONS

Infineon Technologies AG, MOSFET OptiMOS 5 Linear FET, 100 V, IPB017N10N5LF, Feb. 16, 2017, pp. 1-11, Rev. 2.1, Infineon Technologies AG, Munchen, Germany.

* cited by examiner

*Primary Examiner* — Patrick O Neill
(74) *Attorney, Agent, or Firm* — AMPACC Law Group, PLLC

(57) ABSTRACT

A power device includes a first transistor circuit configured to operate in response to a first control signal, a control circuit configured to generate a second control signal in response to the first control signal, and a second transistor circuit configured to operate in response to the second control signal. The second transistor circuit has an active area that is larger than an active area of the first transistor circuit.

20 Claims, 3 Drawing Sheets

POWER TRANSISTOR DEVICE AND METHOD OF CONTROLLING THE SAME

BACKGROUND

The present disclosure relates to a power transistor device and a hot-swap circuit including the power transistor device, and a method of controlling the power transistor device.

A high-availability system, for example, a server, a network switch, and a redundant-array-of-independent-disk (RAID) storage, remains running while one or more of its modules are being replaced. Such a module may include a hot-swap circuit that controls an in-rush current flowing into a load, thereby ensuring safe insertion of the module into a live backplane of the system.

The hot-swap circuit may include a controller (e.g., a hot-swap controller) and a power transistor (e.g., a power MOSFET) that operates in a linear mode to control the in-rush current therethrough. When the power MOSFET operates below a zero temperature coefficient (ZTC) point in the linear mode, an occurrence of one or more hot regions in the power MOSFET may lead to an increased amount of currents flowing through these hot regions, thereby further increasing temperatures of the hot regions. Such a positive feedback may lead to a thermal instability below the ZTC point and to eventual failure of the power MOSFET.

In order to suppress the positive feedback, a conventional power MOSFET increases a channel length and a threshold voltage to reduce the transconductance and the current level of the ZTC point thereof. As a result, power handling capabilities indicated by curves in the safe operating area (SOA) of the conventional power MOSFET are improved. On the other hand, the reduced transconductance of the conventional power MOSFET increases its on-resistance value. As a result, power consumption of a device including the conventional power MOSFET and a load may be relatively great when the conventional power MOSFET transmits supply power to the load.

SUMMARY

Embodiments of the present application relate to a power transistor device and a hot-swap circuit including the power transistor device, and a method of controlling the power transistor device, where the power transistor device includes a first transistor having a first active area, a control circuit, and a second transistor having a second active area that is larger than the first active area of the first transistor. In an embodiment, the first transistor is a first MOSFET, the control circuit includes a control MOSFET, and the second transistor is a second MOSFET, and the first transistor, the control circuit, and the second transistor are integrated in a single chip.

In an embodiment, a power device includes a first transistor circuit configured to operate in response to a first control signal; a control circuit configured to generate a second control signal in response to the first control signal; and a second transistor circuit configured to operate in response to the second control signal, the second transistor circuit having an active area that is larger than an active area of the first transistor circuit.

In an embodiment, a hot-swap circuit includes a power device; and a hot-swap controller configured to generate a first control signal and control an in-rush current flowing through the power transistor device. The power device has a first active area when the first control signal is equal to or greater than a first given value and has a second active area when the first control signal is equal to or greater than a second given value, the second given value being greater than the first given value, the second active area being larger than the first active area.

In another embodiment, a method for controlling a power device includes turning on a first transistor circuit of the power device when a value of a first control signal is equal to or greater than a first given value, the first transistor circuit having a first active area; and turning on a second transistor circuit of the power device when the value of the first control signal is equal to or greater than a second given value, the second given value being greater than the first given value, the second transistor circuit having a second active area that is larger than the first active area of the first transistor circuit.

DETAILED DESCRIPTION

Figure 1:
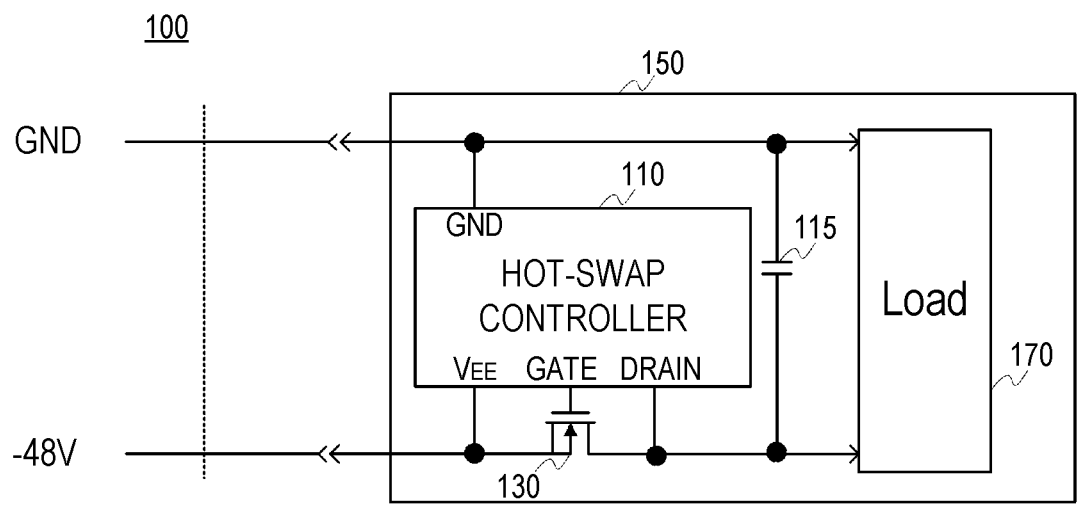
FIG. 1 illustrates a portion of a high-availability system according to an embodiment of the present disclosure.

Embodiments of the present application relate to a power transistor device (or a power device), a hot-swap circuit including the power transistor device, and a method of controlling the power transistor device, where the power transistor device includes a first transistor circuit having a first active area, a control circuit, and a second transistor circuit having a second active area that is larger than the first active area of the first transistor circuit. The first transistor circuit having a relatively small active area reduces occurrence of a thermal instability that may result from a positive feedback when the power device is operating below a zero temperature coefficient (ZTC) point. The second transistor circuit having a relatively large active area reduces power consumption by the power device. In an embodiment, the second active area is at least 10 times larger than the first active area. In another embodiment, the second active area is at least 25 times larger than the first active area. In yet another embodiment, the second active area is at least 50, at least 75, or at least 100, or at least 150 times, or at least 200 times larger than the first active area.

In an embodiment, when a first control signal has a value in a first range, the first transistor circuit is turned on and the second transistor circuit is turned off. When the power transistor device operates below a zero temperature coefficient (ZTC) point within the first range, because the first transistor circuit has a relatively small active area, an occurrence of a thermal instability below the ZTC point that may result from a positive feedback may be substantially prevented, thereby improving power handling capabilities as indicated in a safe operating area (SOA) of the power transistor device.

In an embodiment, when the first control signal that has a value in a second range, the first transistor circuit remains turned on and the control circuit generates a second control signal that turns on the second transistor circuit. Because the second transistor circuit has a relatively large active area, an on-resistance value of the power transistor device when the first and second transistor circuits are turned on is relatively small, thereby reducing power consumption compared to a conventional power transistor device.

In an embodiment, the control circuit is implemented in a single chip with the first and second transistor circuits, which simplifies the circuit structure. As a result, manufacturing cost of the power transistor device including the control circuit may be reduced and a yield of the power transistor device may be increased.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

FIG. 1 illustrates a portion of a high-availability system 100 that includes a −48V backplane and a plurality of removable modules 150 according to an embodiment of the present disclosure. For illustrative convenience, only one removable module 150 is shown. In an embodiment, the high-availability system 100 may be a server, a network switch, a redundant-array-of-independent-disk (RAID) storage, or other electronic devices.

In an embodiment, the removable module 150 includes a hot-swap controller 110 and a power transistor device 130. The removable module 150 may be a printed-circuit board (PCB) or a plug-in-module.

When the removable module 150 is first inserted into the backplane, its uncharged capacitors including a bypass capacitor 115 demand an in-rush current having a relatively large magnitude to charge up a load 170. The hot-swap controller 110 and the power transistor device 130 of the removable module 150 controls an amount of the in-rush current to ensure safe insertion of the removable module 150 into the backplane, so that the high-availability system 100 would not experience a significant brownout of the backplane and damage to components of the inserted removable module 150.

Although the high-availability system 100 is illustrated with the −48V backplane, embodiments of the present disclosure are not limited thereto. For example, the high-availability system 100 may include a +12V backplane (not shown).

Although the removable module 150 includes the hot-swap controller 110 and the power transistor device 130, embodiments of the present disclosure are not limited thereto. In another embodiment (not shown), the hot-swap controller 110 and the power transistor device 130 may be disposed between a plurality of power supplies (not shown) and a power converter (not shown). When one of the plurality of power supplies is coupled to the power converter, the hot-swap controller 110 and the power transistor device 130 may control an amount of an in-rush current flowing from the coupled power supply (not shown) to the power converter (not shown) during a given time interval, thereby substantially preventing damage to one or more components of the power converter (not shown).

Figure 2:
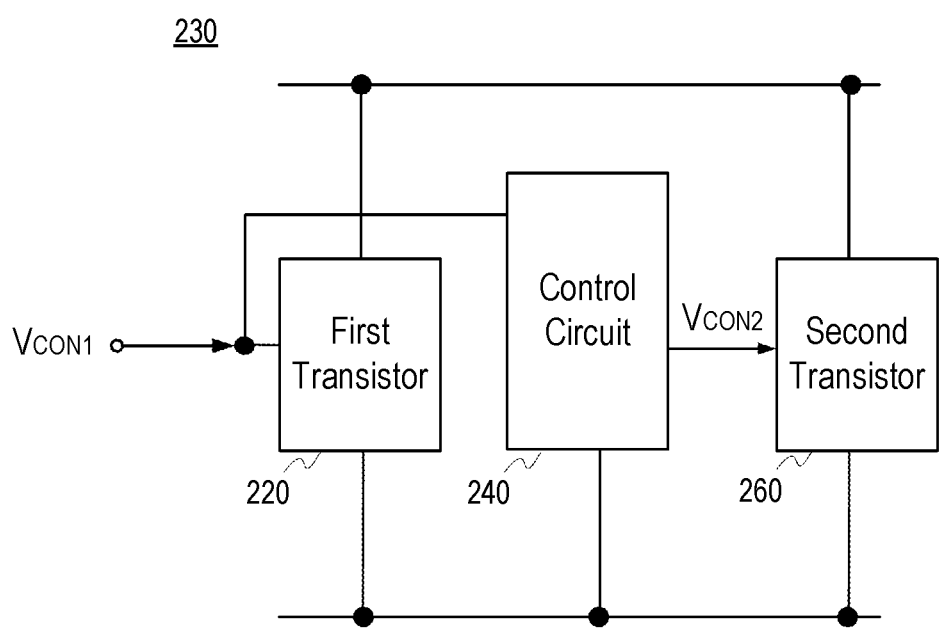
FIG. 2 illustrates a power transistor device according to an embodiment of the present disclosure.

FIG. 2 illustrates a power transistor device 230 according to an embodiment of the present disclosure. The power transistor device 230 includes a first transistor circuit 220, a control circuit 240, and a second transistor circuit 260.

The first transistor circuit 220 receives a first control signal (e.g., a first control voltage) $V_{CON1}$ and operates in response to the first control signal $V_{CON1}$. For example, the first transistor circuit 220 is turned on when the first control signal has a value in a first range (e.g., a first range shown in FIG. 4) and in a second range (e.g., a second range shown in FIG. 4).

The control circuit 240 receives the first control voltage $V_{CON1}$ and generates a second control signal (e.g., a second control voltage) $V_{CON2}$ in response to the first control voltage $V_{CON1}$. In an embodiment, when the first control voltage $V_{CON1}$ is equal to or greater than a given level, the control circuit 240 generates the second control voltage $V_{CON2}$ that is sufficiently great to turn on the second transistor circuit 260.

The second transistor circuit 260 receives the second control signal $V_{CON2}$ and operates in response to the second control signal $V_{CON2}$. For example, the second transistor circuit is 260 is turned on in response to the second control signal $V_{CON2}$ when the first control signal $V_{CON1}$ has a value in a second range (e.g., the second range shown in FIG. 4).

The second transistor circuit 260 has an active area that is greater than an active area of the first transistor circuit 220. In an embodiment, the first and second transistor circuits 220 and 260 each have a single transistor, and the latter is provided with a bigger transistor so that it would have a larger active area than that of the first transistor circuit 220. In another embodiment, the second transistor circuit 260 is provided with a larger active area by providing it with a plurality of transistors. For example, the second transistor circuit 260 may be provided with 10, 15, 25, 50, 75, 100, 125, 150, 175, 200, or more transistors than the first transistor circuit 220, so that the second transistor circuit 260 would have significantly larger active area than the first transistor circuit 220. Each of these transistors of the second transistor circuit 260 may have substantially the same configuration for ease of design and fabrication.

Figure 3:
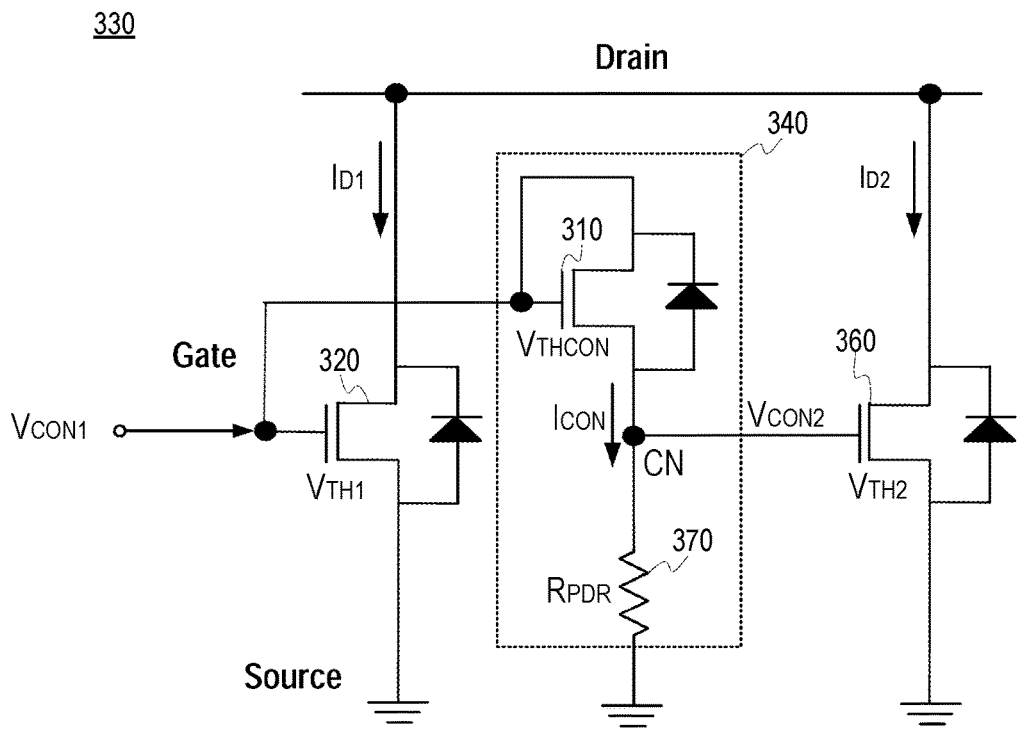
FIG. 3 illustrates a power MOSFET device suitable for use as the power transistor device in FIG. 2 according to an embodiment of the present disclosure.

FIG. 3 illustrates a power transistor device (or a power device) 330 according to an embodiment of the present disclosure. The power device 330 is a power MOSFET device in this implementation. In FIG. 3, the power MOSFET device 330 includes a first transistor circuit 320, a control circuit 340, and a second transistor circuit 360. The first transistor circuit 320 includes a first MOSFET 322, and the second transistor circuit 360 includes a second MOSFET 362. In an embodiment illustrated in FIG. 3, the first and second transistor circuits 320 and 360 each is implemented using a single transistor or MOSFET.

The first MOSFET 322 of the first transistor circuit 320 is an n-channel MOSFET, but embodiments of the present disclosure are not limited thereto. The first MOSFET 322 has a gate receiving a first control signal (e.g., a first control voltage) $V_{CON1}$, a source connected to a ground, and a drain connected to a drain of the second MOSFET 362 of the second transistor circuit 360. In the embodiment shown in FIG. 3, the n-channel MOSFET 322 has the gate receiving the first control voltage $V_{CON1}$ and the source connected to the ground, and thus a gate-source voltage applied to the n-channel MOSFET 322 is equal to the first control voltage $V_{CON1}$. However, embodiments of the present disclosure are not limited thereto. For example, the source of the n-channel MOSFET 322 may be connected to a negative electric potential (e.g., −48V shown in FIG. 1) or a positive electric potential depending on implementation.

The control circuit 340 includes a control transistor (e.g., a control MOSFET) 310 and a resistor (or a pull-down resistor) 370. The control MOSFET 310 is a diode-connected transistor having a gate connected to a drain, and the gate of the control MOSFET 310 is also connected to the gate of the first MOSFET 322. The control MOSFET 310 further has a source connected to a first end of the pull-down resistor 370 at a control node CN. A second end of the pull-down resistor 370 is connected to the ground.

The second MOSFET 362 of the second transistor circuit 360 is an n-channel MOSFET, but embodiments of the present disclosure are not limited thereto. The second MOSFET 362 has a gate connected to the control node CN, a source connected to the ground, and the drain connected to the drain of the first MOSFET 322.

In an embodiment, the first MOSFET 322, the control circuit 340, and the second MOSFET 362 are integrated in a single chip. The control MOSFET may be any one of a trench MOSFET, a lateral MOSFET, and a Complementary MOSFET. For example, the first MOSFET 322 and the second MOSFET 362 are implemented as a trench MOSFET formed in a single substrate, and the control MOSFET 310 is implemented as a lateral MOSFET that is disposed between the first and second MOSFETs 322 and 362 in the substrate. The power MOSFET device 330 according to an embodiment of the present disclosure includes the control circuit 340 that is integrated in the same chip as the first and second MOSFETs 322 and 362. In contrast, a conventional power MOSFET device may include a controller that is implemented as a separate and distinct chip. The integration of the first and second MOSFETs 322 and 362 and the control circuit 340 into a single chip simplifies manufacturing of the power MOSFET device 330, thereby reducing the manufacturing cost while increasing the yield.

Figure 4:
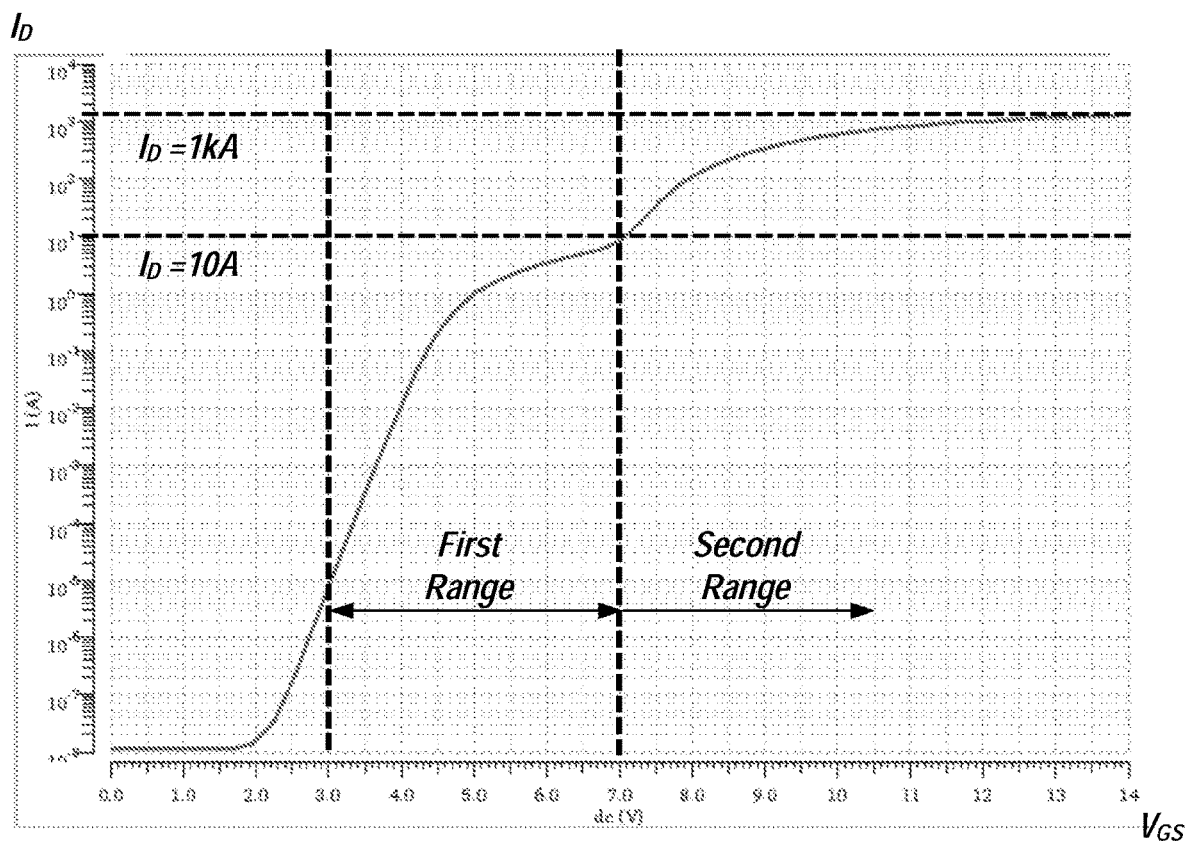
FIG. 4 illustrates an operation of the power MOSFET device shown in FIG. 3 according to an embodiment of the present disclosure.

FIG. 4 illustrates an operation of the power MOSFET device 330 in FIG. 3 according to an embodiment of the present disclosure. FIG. 4 includes a waveform of a drain current $I_D$ as a function of a gate-source voltage $V_{GS}$ applied to the gate of the first MOSFET 322 and the gate of the control MOSFET 310, according to an embodiment. Because the source of the first MOSFET 322 is connected to the ground, the gate-source voltage $V_{GS}$ of FIG. 4 is equal to the first control voltage $V_{CON1}$ of FIG. 3, but embodiments of the present disclosure are not limited thereto.

When the gate-source voltage $V_{GS}$ is less than a first threshold voltage $V_{TH1}$ of the first MOSFET 322, the first MOSFET 322, the control MOSFET 310, and the second MOSFET 362 are turned off. When the first threshold voltage $V_{TH1}$ of the first MOSFET 322 is substantially equal to 3V in the embodiment shown in FIG. 4, a first drain current $I_{D1}$ is substantially prevented from flowing through the first MOSFET 322 in response to the gate-source voltage $V_{GS}$ less than the first threshold voltage $V_{TH1}$.

When the gate-source voltage $V_{GS}$ becomes equal to or greater than the first threshold voltage $V_{TH1}$ of the first MOSFET 322, the first MOSFET 322 is turned on and a first drain current $I_{D1}$ flows through the first MOSFET 322. In an embodiment, a threshold voltage $V_{THCON}$ of the control MOSFET 310 is substantially equal to the first threshold voltage $V_{TH1}$ of the first MOSFET 322, and thus the control MOSFET 310 is also turned on when the gate-source voltage $V_{GS}$ becomes equal to or greater than the first threshold voltage $V_{TH1}$ of the first MOSFET 322. However, embodiments of the present disclosure are not limited thereto, and the threshold voltage $V_{THCON}$ of the control MOSFET 310 may be different from the first threshold voltage $V_{TH1}$ of the first MOSFET 322 in other embodiments.

When the gate-source voltage $V_{GS}$ is equal to or greater than the threshold voltage $V_{THCON}$ of the control MOSFET 310, the control MOSFET 310 is turned on and a drain current $I_{CON}$ flowing through the control MOSFET 310 can be represented by the following equation:

$$I_{CON}=K(V_{GS}-V_{THCON})^2 \qquad \text{Equation 1.}$$

In Equation 1, K is a given constant, which can be represented by $\mu*C_{OX}*W/(2*L)$ where $\mu$ is a charge-carrier effective mobility, $C_{OX}$ is a gate oxide capacitance per unit area, W is a channel width, and L is a channel length.

As a result, a second control signal $V_{CON2}$ (e.g., a control voltage $V_{CON2}$) at the control node CN can be represented by the following equation:

$$V_{CON2}=I_{CON}*R_{PDR}=K(V_{GS}-V_{THCON})^2*R_{PDR} \qquad \text{Equation 2.}$$

In Equation 2, $R_{PDR}$ is a resistance value of the pull-down resistor 370.

In an embodiment, the resistance value $R_{PDR}$ of the pull-down resistor 370 is determined such that the second control voltage $V_{CON2}$ reaches a second threshold voltage $V_{TH2}$ of the second MOSFET 362 when the gate-source voltage $V_{GS}$ is equal to a sum of the threshold voltage $V_{THCON}$ of the control MOSFET 310 and the second threshold voltage $V_{TH2}$ of the second MOSFET 362. In such an embodiment, the resistance value $R_{PDR}$ of the pull-down resistor 370 can be represented by the following equation:

$$R_{PDR}=1/(K*V_{TH2}) \qquad \text{Equation 3.}$$

When the gate-source voltage $V_{GS}$ becomes equal to or greater than the sum of the threshold voltage $V_{THCON}$ of the control MOSFET 310 and the second threshold voltage $V_{TH2}$ of the second MOSFET 362, the second control voltage $V_{CON2}$ at the control node CN is equal to or greater than the second threshold voltage $V_{TH2}$ of the second MOSFET 362. As a result, the second MOSFET 362 is turned on and a second drain current $I_{D2}$ flows through the second MOSFET 360.

Referring back to FIG. 4, when the gate-source voltage $V_{GS}$ is in a first range from the first threshold voltage $V_{TH1}$ (e.g., 3V in FIG. 4) of the first MOSFET 322 to the sum (e.g., 7V in FIG. 4) of the threshold voltage $V_{THCON}$ (e.g., 4V in FIG. 4) of the control MOSFET 310 and a second threshold voltage $V_{TH2}$ (e.g., 3V in FIG. 4) of the second MOSFET 362, the first MOSFET 320 is turned on and the second MOSFET 362 is turned off. As a result, the drain current $I_D$ in FIG. 4 is equal to the first drain current $I_{D1}$. In the first range of the gate-source voltage $V_{GS}$, the power MOFET device 330 operates in a linear mode and controls an amount of an in-rush current flowing through the power MOSFET device 330. For example, a zero temperature coefficient (ZTC) point of the power MOSFET device 330 operating in the linear mode lies within the first range.

When the gate-source voltage $V_{GS}$ is in a second range that is equal to greater than the sum (e.g., 7V in FIG. 4) of the threshold voltage $V_{THCON}$ of the control MOSFET 310 and the second threshold voltage $V_{TH2}$ of the second MOSFET 360, both of the first MOSFET 322 and the second MOSFET 360 are turned on. As a result, the drain current $I_D$ in FIG. 4 is equal to the sum of the first drain current $I_{D1}$ flowing through the first MOSFET 322 and the second drain current $I_{D2}$ flowing through the second MOSFET 362.

The second MOSFET 362 has an active area that is larger than an active area of the first MOSFET 322. For example, in the embodiment shown in FIG. 4, the active area of the second MOSFET 362 is about 100 times larger than the active area of the first MOSFET 322. As a result, a saturated amount of the drain current $I_D$ in the second range where the first MOSFET 322 and the second MOSFET 362 are turned on is 1 kA, which is about 100 times greater than a saturated amount (i.e., 10A in FIG. 4) of the drain current $I_D$ in the first range where the first MOSFET 322 is turned on and the second MOSFET 362 is turned off.

In an embodiment, the first transistor circuit 320 has a single MOSFET, i.e., the first MOSFET 322, and the second transistor circuit 360 has a plurality of MOSFETs, each having substantially the same configuration as the first MOSFET 322. For example, the given number is in a range from 10 to 200. As a result, the active area of the second transistor circuit 360 is the given number of times larger than the active area of the first transistor circuit 320, whereas the first threshold voltage $V_{TH1}$ of the first MOSFET 322 is substantially the same as the second threshold voltage $V_{TH2}$. For example, a difference between the first threshold voltage $V_{TH1}$ of the first MOSFET 322 and the second threshold voltage $V_{TH2}$ is equal to or less than 0.1%, 0.3%, 0.5%, 1%, 3%, 5%, and 10% of any one of the first threshold voltage $V_{TH1}$ of the first MOSFET 322, the second threshold voltage $V_{TH2}$, and an average of the first and second threshold voltages $V_{TH1}$ and $V_{TH2}$.

As described above, when the gate-source voltage $V_{GS}$ lies in the first range from the first threshold voltage $V_{TH1}$ of the first MOSFET 322 to the sum of the threshold voltage $V_{THCON}$ of the control MOSFET 310 and the second threshold voltage $V_{TH2}$ of the second MOSFET 362, the drain current $I_D$ in FIG. 4 is equal to the first drain current $I_{D1}$ flowing through the first MOSFET 322. For example, the sum of the threshold voltage $V_{THCON}$ of the control MOSFET 310 and the second threshold voltage $V_{TH2}$ of the second MOSFET 362 is greater than the ZTC point of the power MOSFET device 330. The threshold voltage $V_{THCON}$ of the control MOSFET 310 is sufficiently high to make the sum of the threshold voltage $V_{THCON}$ of the control MOSFET 310 and the second threshold voltage $V_{TH2}$ of the second MOSFET 362 greater than the ZTC point of the power MOSFET device 330. As a result, the power MOSFET device 330 operates in a linear mode to control an amount of an in-rush current when the gate-source voltage $V_{GS}$ lies in at least a lower portion of the first range. In addition, the threshold voltage $V_{THCON}$ of the control MOSFET 310 is sufficiently low to avoid applying an excessive drain-source voltage to the control MOSFET 310. When the power MOSFET device 330 including the first MOSFET 322 (or the first transistor circuit 320) operates below the ZTC point, because the active area of the first transistor circuit 320 is relatively small, a current level of the ZTC point may be reduced and one or more local hot spots may not be initiated to trigger a positive feedback. As a result, an occurrence of a thermal instability below the ZTC point resulting from the positive feedback may be substantially prevented, thereby improving power handling capabilities of the power MOSFET device 330 as indicated in the SOA thereof. In addition, the control circuit 340 according to an embodiment of the present disclosure for improving the power handling capabilities of the power MOSFET device 330 can be implemented into a single chip with the first and second MOSFETs 322 and 362 (or first and second transistor circuits 320 and 360), which would simplify the manufacturing process, which in turn would reduce the manufacturing cost and increase the yield compared to a conventional power MOSFET device including a controller.

When the gate-source voltage $V_{GS}$ is in the second range that is equal to greater than the sum of the threshold voltage $V_{THCON}$ of the control MOSFET 310 and the second threshold voltage $V_{TH2}$ of the second MOSFET 362, the drain current $I_D$ is equal to the sum of the first drain current $I_{D1}$ flowing through the first MOSFET 322 and the second drain current $I_{D2}$ flowing through the second MOSFET 362. When the power MOSFET device 330 operates in the second range of the gate-source voltage $V_{GS}$, an amount of the drain current $I_D$ is relatively large and an on-resistance value of the power MOSFET device 330 including the first and second MOSFETs 322 and 362 is relatively small. Because the on-resistance value of the power MOSFET device 330 according to an embodiment of the present disclosure is smaller than an on-resistance value of a conventional power MOSFET having a relatively long channel length and a relatively high threshold voltage for improved SOA capability performance, the power MOSFET device 330 according to an embodiment of the present disclosure may reduce power consumption compared to a device including the conventional power MOSFET.

Figure 5:
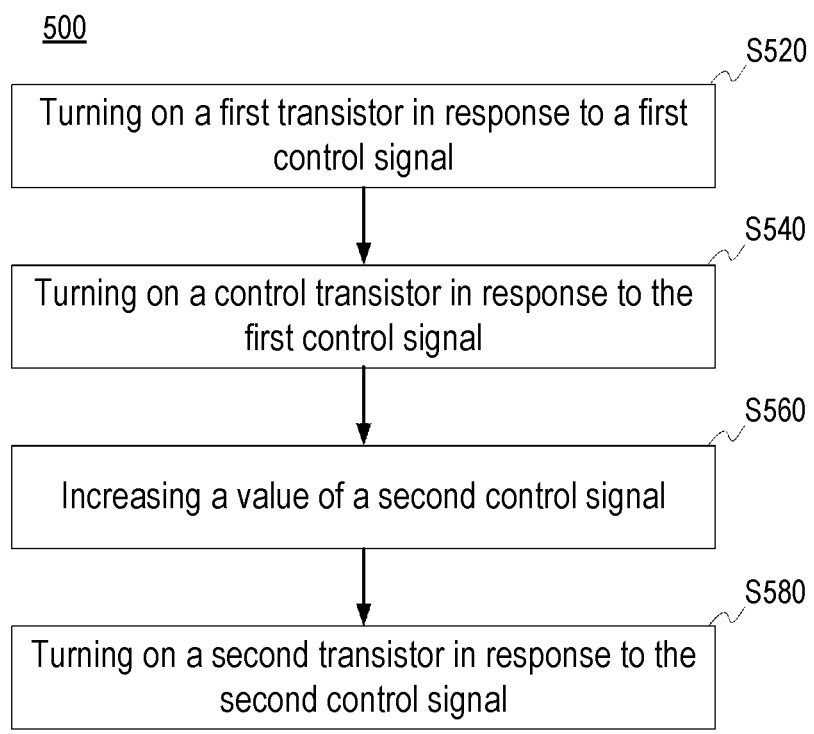
FIG. 5 is a flowchart illustrating a process performed by a power transistor device according to an embodiment.

FIG. 5 illustrates a process 500 performed by a power device (e.g., the power MOSFET device 330 in FIG. 3) according to an embodiment. In an embodiment, the power device includes a first transistor circuit, a control circuit, and a second transistor, as illustrated in FIG. 3.

At S520, a first transistor (e.g., the first MOSFET 322) of the first transistor circuit (e.g., the first transistor circuit 320) is turned on when a value of a first control signal (e.g., the first control signal $V_{CON1}$ in FIG. 3) is equal to or greater than a first given value. In an embodiment, the first given value is a threshold voltage of the first transistor, the first transistor having a first active area.

At S540, the control transistor is turned on in response to the first control signal to generate a current flowing through the control transistor. In an embodiment, the control transistor is turned on when a value of the first control signal is equal to or greater than a threshold value of the control transistor.

At S560, a value of a second control signal is increased using a resistor into which the current flows. In an embodiment, a voltage level across the resistor increases when an amount of the current flowing through the control transistor increases in response to an increased value of the first control signal.

At S580, a second transistor (e.g., the second MOSFET 362) of the second transistor circuit (e.g., the second transistor circuit 360) is turned on when the value of the first control signal is equal to or greater than a second given value, which makes the value of the second control signal equal to or greater than a threshold value of the second transistor. The second transistor has a second active area that is at least 10 times larger than the first active area of the first transistor.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A power device comprising:
   a first transistor circuit configured to operate in response to a first control signal;
   a control circuit configured to generate a second control signal in response to the first control signal; and
   a second transistor circuit configured to operate in response to the second control signal, the second transistor circuit having an active area that is larger than an active area of the first transistor circuit.

2. The power device of claim 1, wherein the first transistor circuit, the control circuit, and the second transistor circuit are integrated in a single chip.

3. The power device of claim 1, wherein the control circuit includes a control transistor having a control terminal that receives the first control signal, a first end terminal coupled to the control terminal, and a second end terminal coupled to a control terminal of the second transistor circuit.

4. The power device of claim 1, wherein the first transistor circuit is turned on when a value of the first control signal is equal to or greater than a first given value, and
   wherein the second transistor circuit is turned on when the value of the first control signal is equal to or greater than a second given value, the second given value being greater than the first given value.

5. The power device of claim 1, wherein the first transistor circuit includes a first MOSFET, the second transistor circuit includes a second MOSFET, and the control circuit includes a control MOSFET that is a diode-connected MOSFET, and
   wherein the second MOSFE has an active area that is at least 10 times larger than an active area of the first MOSFET.

6. The power device of claim 5, wherein the first MOSFET has a gate receiving the first control signal and is turned on when a value of the first control signal is equal to or greater than a first given value, and
   wherein the second MOSFET has a gate receiving the second control signal and is turned on when a value of the first control signal is equal to or greater than a second given value, the second given value being greater than the first given value.

7. The power device of claim 6, wherein a gate-source voltage of the first MOSFET is greater than a voltage at a zero temperature coefficient (ZTC) point when the first control signal is equal to the second given value.

8. The power device of claim 5, wherein the control circuit further includes:
   a resistor having a first end coupled to a ground and a second end; and
   a control node at which the second end of the resistor is coupled to a source of the control MOSFET and generating the second control signal.

9. The power device of claim 8, wherein the resistor has a resistance value that makes a value of a gate-source voltage of the second MOSFET equal to a threshold voltage of the second MOSFET when a gate-source voltage of the first MOSFET is equal to a sum of a threshold voltage of the control MOSFET and the threshold voltage of the second MOSFET.

10. The power device of claim 5, wherein a first threshold value of the first MOSFET is equal to a second threshold value of the second MOSFET.

11. The power device of claim 10, wherein the first transistor circuit includes a single first MOSFET, and the second transistor circuit includes a plurality of second MOSFETs, each of the plurality of second MOSFETs having an active area that is the same size as that of the first MOSFET.

12. The power device of claim 5, wherein the first MOSFET, the second MOSFET, and the control MOSFET are integrated in a single chip, the control MOSFET being disposed between the first MOSFET and the second MOSFET, and
   wherein the control MOSFET is any one of a trench MOSFET, a lateral MOSFET, and a Complementary MOSFET.

13. A hot-swap circuit comprising:
    a power device; and
    a hot-swap controller configured to generate a first control signal and control an in-rush current flowing through the power device,
    wherein the power device has a first active area when the first control signal is equal to or greater than a first given value and has a second active area when the first control signal is equal to or greater than a second given value, the second given value being greater than the first given value, the second active area being larger than the first active area.

14. The hot-swap circuit of claim 13, wherein the power device includes:
    a first transistor circuit configured to operate in response to the first control signal;
    a control circuit configured to generate a second control signal in response to the first control signal; and
    a second transistor circuit configured to operate in response to the second control signal.

15. The hot-swap circuit of claim 14, wherein the first transistor circuit, the control circuit, and the second transistor circuit are integrated in a single chip.

16. A method for controlling a power device, the method comprising:
    turning on a first transistor circuit of the power device when a value of a first control signal is equal to or greater than a first given value, the first transistor circuit having a first active area; and
    turning on a second transistor circuit of the power device when the value of the first control signal is equal to or greater than a second given value, the second given value being greater than the first given value, the second transistor circuit having a second active area that is larger than the first active area of the first transistor circuit.

17. The method of claim 16, further comprising:
    generating a second control signal in response to the first control signal; and
    outputting the second control signal from a control node to the second transistor circuit.

18. The method of claim 17, wherein the second transistor circuit is turned on in response to the second control signal.

19. The method of claim 16, further comprising:
    turning on a control transistor of the power device in response to the first control signal to generate a current flowing through the control transistor; and
    increasing a value of a second control signal using a resistor into which the current flows.

20. The method of claim 19, wherein the first transistor circuit includes a first MOSFET, the second transistor circuit includes a second MOSFET, and the control transistor is a diode-connected MOSFET, and wherein the first MOSFET, the second MOSFET, and the diode-connected MOSFET are integrated in a single chip.

* * * * *